United States Patent
Cooper et al.

(10) Patent No.: US 10,476,462 B2
(45) Date of Patent: Nov. 12, 2019

(54) FILTER COMPONENT TUNING USING SIZE ADJUSTMENT

(71) Applicant: Nokia Solutions and Networks Oy, Espoo (FI)

(72) Inventors: Steven J. Cooper, Moorooka (AU); David R. Hendry, Auchenflower (AU); Brian Hurley, The Gap (AU)

(73) Assignee: Nokia Solutions and Networks Oy, Espoo (FI)

( * ) Notice: Subject to any disclaimer, the term of this patent is extended or adjusted under 35 U.S.C. 154(b) by 330 days.

(21) Appl. No.: 15/351,646

(22) Filed: Nov. 15, 2016

(65) Prior Publication Data
US 2018/0041181 A1 Feb. 8, 2018

Related U.S. Application Data (63) Continuation-in-part of application No. 15/227,169, filed on Aug. 3, 2016, now Pat. No. 9,882,792.

(51) Int. Cl.
*H03H 3/00* (2006.01)
*G01R 23/07* (2006.01)
(Continued)

(52) U.S. Cl.
CPC ............... *H03H 3/00* (2013.01); *G01R 23/07* (2013.01); *H01P 1/2086* (2013.01); *H01P 7/06* (2013.01);
(Continued)

(58) Field of Classification Search
CPC ........ H03H 3/00; H03H 3/013; H01P 1/2002; H01P 1/2084; H01P 1/2086; H01P 7/10;
(Continued)

(56) References Cited

U.S. PATENT DOCUMENTS

| | | | |
|---|---|---|---|
| 3,657,670 A | 4/1972 | Kitazume et al. | 333/73 W |
| 4,879,533 A | 11/1989 | de Muro et al. | 333/206 |

(Continued)

FOREIGN PATENT DOCUMENTS

| | | | | |
|---|---|---|---|---|
| JP | 2002135003 A | 5/2002 | | |
| JP | 3852598 B2 | * 11/2006 | ............ | H01P 1/2088 |

(Continued)

OTHER PUBLICATIONS

Machine translation of JP-3852598-B2 provided by JPO website (AIPN). Translated on Apr. 3, 2019, publication date of JP-3852598-B2 Nov. 2006. (Year: 2019).*

(Continued)

*Primary Examiner* — Peter Dungba Vo
*Assistant Examiner* — Joshua D Anderson
(74) *Attorney, Agent, or Firm* — Harrington & Smith (57) ABSTRACT

A method for tuning a filter component using size adjustment includes measuring a first frequency of a first resonant mode of a dielectric resonator component of an RF filter, said dielectric resonator component being a block of dielectric material having a cuboid shape with three pairs of opposite faces. The first resonant mode has an electric-field component oriented in a direction perpendicular to one of the pairs of opposite faces and parallel to the other two pairs of opposite faces. When a measured value of the first frequency of the first resonant mode is less than a desired value, dielectric material is removed uniformly from at least one face of the two pairs of opposite faces parallel to the electric-field component of the first resonant mode to maintain the cuboid shape of the block of dielectric material. The removal of the dielectric material may be by at least one of lapping, grinding, and milling. The first frequency of the first resonant mode is remeasured to check whether a remeasured value therefor is closer or equal to the desired value without (Continued)

exceeding the desired value. The method is also applicable for tuning multiple modes of dielectric resonator component in the form of a block of dielectric material having a cuboid shape, as well as for tuning multiple modes in dielectric resonator components in the form of blocks of dielectric material having cylindrical and spherical shapes.

6 Claims, 7 Drawing Sheets

(51) Int. Cl.
| | |
|---|---|
| H01P 11/00 | (2006.01) |
| H03H 3/013 | (2006.01) |
| H04B 7/0456 | (2017.01) |
| H04L 7/027 | (2006.01) |
| H04L 12/26 | (2006.01) |
| H01P 1/208 | (2006.01) |
| H01P 7/06 | (2006.01) |
| H01P 7/10 | (2006.01) |

(52) U.S. Cl.
CPC ............ *H01P 7/105* (2013.01); *H01P 11/008* (2013.01); *H03H 3/013* (2013.01); *H04B 7/0456* (2013.01); *H04L 7/0276* (2013.01); *H04L 43/028* (2013.01); *Y10T 29/49016* (2015.01)

(58) Field of Classification Search
CPC ...... H01P 7/105; H01P 11/007; H01P 11/008; Y10T 29/49016
See application file for complete search history.

(56) References Cited

U.S. PATENT DOCUMENTS

| | | | | |
|---|---|---|---|---|
| 4,963,844 | A | 10/1990 | Konishi et al. | 333/208 |
| 5,023,866 | A | 6/1991 | De Muro | 370/24 |
| 5,307,036 | A | 4/1994 | Turunen et al. | 333/202 |
| 5,325,077 | A | 6/1994 | Ishikawa et al. | 333/219.1 |
| 5,528,204 | A * | 6/1996 | Hoang | H01P 1/2136 333/134 |
| 6,016,091 | A | 1/2000 | Hidaka et al. | 333/202 |
| 6,025,291 | A | 2/2000 | Murakawa | 501/136 |
| 6,133,808 | A | 10/2000 | Arakawa | 333/134 |
| 6,160,463 | A | 12/2000 | Arakawa et al. | 333/202 |
| 6,313,722 | B1 | 11/2001 | Tsuzuki | |
| 6,346,867 | B2 | 2/2002 | Arakawa et al. | 333/208 |
| 6,437,655 | B1 | 8/2002 | Andoh et al. | |
| 6,549,094 | B2 | 4/2003 | Takagi et al. | 333/134 |
| 6,677,837 | B2 | 1/2004 | Kojima et al. | 333/208 |
| 6,762,658 | B1 | 7/2004 | Isomura et al. | 333/202 |
| 6,825,740 | B2 | 11/2004 | Kundu | 333/202 |
| 7,042,314 | B2 | 5/2006 | Wang et al. | 333/202 |
| 8,325,077 | B2 | 12/2012 | Gentric | 341/173 |
| 2001/0000429 | A1 | 4/2001 | Arakawa et al. | 333/208 |
| 2001/0024147 | A1 | 9/2001 | Arakawa et al. | 333/135 |
| 2002/0024410 | A1 | 2/2002 | Guglielmi et al. | 333/202 |
| 2002/0039058 | A1 | 4/2002 | Sano et al. | 333/202 |
| 2003/0006864 | A1 | 1/2003 | Hattori et al. | 333/202 |
| 2003/0016099 | A1 | 1/2003 | Manseau et al. | |
| 2003/0090344 | A1 | 5/2003 | Wang et al. | 333/202 |
| 2003/0227360 | A1 | 12/2003 | Kirihara et al. | 333/239 |
| 2004/0056736 | A1 | 3/2004 | Enokihara et al. | 333/202 |
| 2005/0128031 | A1 | 6/2005 | Wilber et al. | 333/202 |
| 2005/0140474 | A1 | 6/2005 | Kim et al. | 333/219.1 |
| 2005/0253672 | A1 | 11/2005 | Enokihara et al. | 333/219.1 |
| 2006/0139127 | A1 | 6/2006 | Wada et al. | 333/202 |
| 2006/0176131 | A1 | 8/2006 | Junginger | |
| 2006/0202775 | A1 | 9/2006 | Tsuzuki et al. | |
| 2008/0018391 | A1 | 1/2008 | Bates | 327/557 |
| 2008/0211601 | A1 | 9/2008 | Bates | 333/186 |
| 2010/0244992 | A1 | 9/2010 | Kasashima et al. | |
| 2012/0293283 | A1 * | 11/2012 | Vangala | H01P 1/2088 333/209 |
| 2013/0049890 | A1 | 2/2013 | Hendry et al. | |
| 2014/0077900 | A1 | 3/2014 | Rogozine et al. | 333/212 |
| 2016/0182065 | A1 | 6/2016 | Wicpalek | |

FOREIGN PATENT DOCUMENTS

| | | |
|---|---|---|
| JP | 2013168868 A | 8/2013 |
| WO | WO-02078119 A1 | 3/2002 |

OTHER PUBLICATIONS

Dupont, "Properties Handbook", Dupont, p. 4 (30 pgs.), Nov. 2003.
Clemente-Fernandez FJ et al.; "A new sensor-based self-configurable bandstop filter for reducing the energy leakage in industrial microwave ovens"; 2012; Meas.Sci. Technol. 23 (2012); whole document (10 pages).
Anonymous; "Quasi-Newton method"; Wikipedia, the free encyclopedia; 2015; whole document (4 pages).
Hirtenfelder, F.; "Filter Design and Tuning using CST Studio Suite"; 2012; CST—Computer Simulation Technology; whole document (40 pages).
Harscher, P. et al.; "Automated Filter Tuning Using Generalized Low-Pass Prototype Networks and Gradient-Based Parameter Extraction"; 2001; IEEE Transactions on Microwave Theory and Techniques, vol. 49, No. 12, Dec. 2001; pp. 2532-2538.
Gongal-Reddy, V. et al.; "Parallel Computational Approach to Gradient Based EM Optimization of Passive Microwave Circuits"; 2016; IEEE Transactions on Microwave Theory and Techniques, vol. 64, No. 1, Jan. 2016; pp. 44-59.

* cited by examiner

FILTER COMPONENT TUNING USING SIZE ADJUSTMENT

CROSS REFERENCE TO RELATED APPLICATION

This application is a continuation-in-part of U.S. patent application Ser. No. 15/227,169, filed Aug. 3, 2016, the teachings of which are incorporated herein by reference.

TECHNICAL FIELD

This invention relates generally to filter components and, more specifically, relates to a method for the tuning of the filter components.

BACKGROUND

This section is intended to provide a background or context for the invention disclosed below. The description to follow may include concepts that could be pursued, but have not necessarily been previously conceived, implemented or described. Therefore, unless otherwise explicitly indicated below, what is described in this section is not prior art to the description in this application and is not admitted to be prior art by inclusion in this section.

A filter is composed of a number of resonating structures and energy coupling structures which are arranged to exchange radio-frequency (RF) energy among themselves and input and output ports. The pattern of interconnection of these resonators to one another and to the input and output ports, the strength of these interconnections, and the resonant frequencies of the resonators determine the response of the filter.

During the design process for a filter, the arrangement of the parts, the materials from which the parts are made, and the precise dimensions of the parts are determined such that an ideal filter so composed will perform the desired filtering function. If a physical filter conforming exactly to this design could be manufactured, the resulting filter would perform exactly as intended by the designer.

However, in practice the precision and accuracy of manufacture of both the materials and the parts are limited, and the result is errors in resonant frequencies and coupling strengths, which, in turn, cause the filter response to differ from that predicted by an ideal filter model. Often, this departure from the ideal response is sufficiently large to bring the filter outside of its specification. As a result, it is desirable to include in the filter design some means of adjusting the resonator frequencies and couplings to bring the filter response within the specification.

A common way to accomplish this is to include, in or on the filter, tuning screws or other devices, such as are well known in the art. An alternative way often used in small ceramic monoblock filters is to remove selected portions of the metallization on the exterior of these filters, and possibly portions of ceramic as well, to perform the tuning.

Most filters are manufactured as completed units and, subsequent to manufacture, the tuning process is performed on the entire filter. Since adjustments on the filter may interact strongly with one another, the tuning procedure is often quite complicated, and requires a skilled operator.

An alternative tuning method is to build the resonator parts separately, tune them individually to a specification calculated for the separated parts from the ideal filter model, and then assemble them into the final filter. Since the individual parts are simple compared with the fully assembled filter, the tuning procedure for these individual parts can also be made very simple. This minimizes the need for skilled operators to tune the filters. This procedure also provides the benefit of either reducing or entirely eliminating the tuning process for the assembled filter.

In many cases, it is sufficient to adjust only the resonant frequencies of the resonator parts, because the manufacturing precision and accuracy for the resonator parts are good enough to bring the coupling strengths within the required range to allow the performance of the assembled filter to be within specification. In such cases, adjustment of the resonant frequencies is all that is required to tune the individual parts.

To facilitate pretuning of the individual parts, both methods of measurement of the frequencies and methods of adjustment of the frequencies are required. The present specification is concerned with the latter.

A tuning method may include the manipulation of a tuning device or structure included as part of the resonator, such as a tuning screw or deformable metal part. Alternatively, a method may comprise an operation performed on the resonator, such as the removal of material from a selected region. The method may also comprise a combination of these, or any other means or process which can alter the resonant frequencies of the resonator part.

A tuning physical adjustment (commonly abbreviated more simply as "adjustment") can then be defined as one or more manipulations of tuning structures and/or one or more operations causing one or more of the resonant frequencies to be altered. For instance, such physical adjustment includes, but is not limited to, removal of material from a surface or face of a resonator component, drilling of holes in the resonator component, adjustments of screws in the resonator component, and/or denting of material covering the resonator component.

In cases where the parts include multimode resonators, the tuning methods for the parts will need to be capable of independently adjusting the resonant frequencies of the two or more modes of the resonator. For example, if the multimode resonator has three modes requiring independent adjustment, at least three independent tuning adjustments will be required. It is a common situation with multimode resonators that an individual adjustment causes more than one of the mode frequencies to change. As a result, there is no one-to-one correspondence between a single adjustment and a frequency change as there is in a single-mode filter.

In the present discussion, the focus will be upon the removal of material from one or more selected regions of a resonator structure. Unfortunately, ceramic filter components cannot be brought to a desired resonant frequency within the precision required to produce a tuned filter only by adjusting dimensions because of manufacturing spreads in the dielectric constant of the ceramic. That is to say, one manufactured batch of a ceramic material may have a dielectric constant which departs from the dielectric constant of the same material manufactured at a different time. Moreover, there may be variations in the dielectric constant within a single manufactured batch, or, indeed, within a single resonator structure. That is to say, a single resonator structure may not always be homogeneous with respect to dielectric constant. As a consequence, in order to tune the filter components and, hence, the filter overall, the resonant frequencies need to be adjusted to compensate for the dielectric constant variations. For a multimode filter component, there are multiple modes whose frequencies need to be independently adjustable. In addition, to minimize loss in the completed filter, and to maintain the design performance of the filter, the components need to be maintained as close as possible to an ideal shape.

Heretofore, ceramic components, such as monoblock ceramic filters, have been tuned by grinding off small portions of their silver coatings.

Further, the frequencies of donut ceramic resonators have been adjusted by grinding material from one face. The resonant frequency of a donut ceramic resonator is measured in a standard test cavity, then the resonator is removed for grinding, and, subsequently, it is remeasured in the test cavity. However, it is not measured in its final cavity as part of a completed filter. Because of manufacturing spreads in the final cavity, tuning screws are still needed to adjust the final filter.

SUMMARY

This section contains examples of possible implementations and is not meant to be limiting.

A method is disclosed in an exemplary embodiment. The method includes measuring a first frequency of a first resonant mode of a dielectric resonator component of an RF (radio frequency) filter, wherein the dielectric resonator component is a block of dielectric material having a cuboid shape with three pairs of opposite faces. The first resonant mode has an electric-field component oriented in a direction perpendicular to one of the pairs of opposite faces and parallel to the other two pairs of opposite faces.

When a measured value of the first frequency of the first resonant mode is less than a desired value, dielectric material is removed uniformly from at least one face of the two pairs of opposite faces parallel to the electric-field component of the first resonant mode to maintain the cuboid shape of the block of dielectric material. Subsequently, the first frequency of the first resonant mode is remeasured to check whether a remeasured value therefor is closer or equal to the desired value without exceeding the desired value.

In another embodiment, in which the dielectric resonator component is a block of dielectric material having a cuboid shape, the method just described includes, after measuring the first frequency of the first resonant mode, and before removing dielectric material uniformly from at least one face of the two pairs of opposite faces parallel to the electric-field component of the first resonant mode, measuring a second frequency of a second resonant mode of the dielectric resonator component of the RF filter. The second resonant mode has an electric-field component oriented in a direction perpendicular to the electric-field component of the first resonant mode and parallel to a pair of opposite faces.

When a measured value of the second frequency of the second resonant mode is also less than a desired value, and before remeasuring the first frequency of the first resonant mode, dielectric material is removed uniformly from at least one face of the two pairs of opposite faces parallel to the electric-field component of the second resonant mode to maintain the cuboid shape of the block of dielectric material. Subsequently, the second frequency of the second resonant mode is also remeasured to check whether a remeasured value therefor is closer or equal to a desired value for the second frequency without exceeding the desired value of the second frequency.

In still another embodiment, in which the dielectric resonator component is a block of dielectric material having a cuboid shape, the method of the first cuboid embodiment described above includes, after measuring the first frequency of the first resonant mode, and before removing dielectric material uniformly from at least one face of the two pairs of opposite faces parallel to the electric-field component of the first resonant mode, measuring a second frequency and a third frequency of a second resonant mode and a third resonant mode, respectively, of the dielectric resonator component of the RF filter. The second and third resonant modes have respective electric-field components oriented in directions perpendicular to the electric-field component of the first resonant mode, perpendicular to each other, and parallel to pairs of opposite faces.

When measured values of the second frequency and the third frequency of the second resonant mode and the third resonant mode, respectively, are less than desired values, and before remeasuring said first frequency of said first resonant mode, dielectric material is removed uniformly from at least one face of the two pairs of opposite faces parallel to the electric-field component of the second resonant mode and from at least one face of the two pairs of opposite faces parallel to the electric-field component of the third resonant mode to maintain the cuboid shape of the block of dielectric material. Subsequently, the second frequency and the third frequency of the second resonant mode and the third resonant mode, respectively, are also remeasured to check whether remeasured values therefor are closer or equal to desired values for the second and third frequencies without exceeding the desired values of the second and third frequencies.

In another embodiment, the method includes measuring a first frequency of a first resonant mode of a dielectric resonator component of an RF filter, wherein the dielectric resonator component is a block of dielectric material having a cylindrical shape with a pair of opposite end faces and a circularly curved side surface with a first plane region. The first plane region is perpendicular to the opposite end faces, and the first resonant mode has an electric-field component oriented in a direction perpendicular to the pair of opposite end faces.

When a measured value of the first frequency of the first resonant mode is less than a desired value, dielectric material is removed from a surface of the block uniformly from at least one of:
the first plane region,
a second plane region formed by removing dielectric material from the circularly curved side surface of the block, the second plane region being perpendicular to both the first plane region and to the pair of opposite end faces, and
a third plane region formed by removing dielectric material from the circularly curved side surface of the block, the third plane region being diametrically opposite to the first plane region and parallel thereto, and perpendicular to the pair of opposite end faces.

Subsequently, the first frequency of the first resonant mode is remeasured to check whether a remeasured value therefor is closer or equal to the desired value without exceeding the desired value.

In another embodiment, in which the dielectric resonator component is a block of dielectric material having a cylindrical shape with a pair of opposite end faces and a circularly curved side surface with a first plane region, the above method includes, after measuring the first frequency of the first resonant mode, and before removing dielectric material from the surface of the block uniformly from at least one of the first plane region, the second plane region, and the third plane region, measuring a second frequency of a second resonant mode of the dielectric resonator component of the RF filter, the second resonant mode having an electric-field component oriented in a direction perpendicular to the electric-field component of the first resonant mode, substantially parallel to a diameter of the circularly curved side surface of the block, and perpendicular to the first plane region.

When a measured value of the second frequency of the second resonant mode is less than a desired value, and before remeasuring the first frequency of the first resonant mode, dielectric material is removed uniformly from at least one of:
  one of the opposite end faces,
  the first plane region,
  the second plane region,
  the third plane region, and
  a fourth plane region formed by removing dielectric material from the circularly curved side surface of the block, the fourth plane region being diametrically opposite to the second plane region and parallel thereto, and perpendicular to the pair of opposite end faces.

Subsequently, the second frequency of the second resonant mode is remeasured to check whether a remeasured value therefor is closer or equal to a desired value for the second frequency without exceeding the desired values of the first and second frequencies.

In another embodiment, in which the dielectric resonator component is a block of dielectric material having a cylindrical shape with a pair of opposite end faces and a circularly curved side surface with a first plane region, the method includes, after measuring the first frequency of the first resonant mode, and before removing dielectric material from a surface of the block uniformly from at least one of the first plane region, the second plane region, and the third plane region, measuring a second frequency and a third frequency of a second resonant mode and a third resonant mode, respectively, of the dielectric resonator component of the RF filter, the second and third resonant modes having respective electric-field components oriented in directions perpendicular to the electric-field component of the first resonant mode, substantially parallel to diameters of said circularly curved side surface of the block, and substantially perpendicular to each other, the second resonant mode further being perpendicular to the first plane region.

When measured values of the second frequency and the third frequency of the second resonant mode and the third resonant mode, respectively, are less than desired values, and before remeasuring the first frequency of the first resonant mode, removing dielectric material uniformly from at least one of:
  one of the opposite end faces,
  the first plane region,
  the second plane region,
  the third plane region, and
  a fourth plane region formed by removing dielectric material from the circularly curved side surface of the block, the fourth plane region being diametrically opposite to the second plane region and parallel thereto, and perpendicular to the pair of opposite end faces.

Subsequently, the second frequency and the third frequency of the second resonant mode and the third resonant mode, respectively, are remeasured to check whether remeasured values therefor are closer or equal to desired values for the second and third frequencies without exceeding the desired values of the first, second, and third frequencies.

In still another embodiment, a method includes measuring a first frequency of a first resonant mode of a dielectric resonator component of an RF filter, the dielectric resonator component being a block of dielectric material having a cylindrical shape with a pair of opposite end faces and a circularly curved side surface with a first plane region, the first plane region being perpendicular to said opposite end faces, the first resonant mode having an electric-field component oriented in a direction perpendicular to said first plane region.

When a measured value of the first frequency of the first resonant mode is less than a desired value, dielectric material is removed from a surface of the block uniformly from at least one of:
  one of the opposite end faces,
  the first plane region,
  a second plane region formed by removing dielectric material from the circularly curved side surface of the block, the second plane region being perpendicular to both the first plane region and to the pair of opposite end faces, and
  a third plane region formed by removing dielectric material from the circularly curved side surface of the block, the third plane region being diametrically opposite to the first plane region and parallel thereto, and perpendicular to the pair of opposite end faces.

Subsequently, the first frequency of the first resonant mode is remeasured to check whether a remeasured value therefor is closer or equal to the desired value without exceeding the desired value.

In another embodiment, in which the dielectric resonator component is a block of dielectric material having a cylindrical shape with a pair of opposite end faces and a circularly curved side surface with a first plane region, the above method includes, after measuring the first frequency of the first resonant mode, and before removing dielectric material from a surface of the block uniformly from at least one of one of the opposite end faces, the first plane region, the second plane region, and the third plane region, measuring a second frequency of a second resonant mode of the dielectric resonator component of the RF filter, the second resonant mode having an electric-field component oriented in a direction perpendicular to the electric-field component of the first resonant mode, and perpendicular to the pair of opposite end faces.

When a measured value of the second frequency of the second resonant mode is less than a desired value, and before remeasuring the first frequency of the first resonant mode, dielectric material is removed uniformly from at least one of:
  the first plane region,
  the second plane region,
  the third plane region, and
  a fourth plane region formed by removing dielectric material from the circularly curved side surface of the block, the fourth plane region being diametrically opposite to the second plane region and parallel thereto, and perpendicular to the pair of opposite end faces.

Subsequently, the second frequency of the second resonant mode is remeasured to check whether a remeasured value therefor is closer or equal to a desired value for the second frequency without exceeding the desired values of the first and second frequencies In another embodiment, in which the dielectric resonator component is a block of dielectric material having a cylindrical shape with a pair of opposite end faces and a circularly curved side surface with a first plane region, the method includes, after measuring the first frequency of the first resonant mode, and before removing dielectric material from a surface of the block uniformly from at least one of one of the opposite end faces, the first plane region, the second plane region, and the third plane region, measuring a second frequency and a third frequency of a second resonant mode and a third resonant mode, respectively, of the dielectric resonator component of the RF filter, the second and third resonant modes having respective electric-field components oriented in directions perpendicular to the electric-field component of the first resonant mode, said electric-field component of said second resonant mode being perpendicular to said pair of end faces, and said electric-field component of said third resonant mode being substantially parallel to the diameter of said circularly curved side surface of said block and substantially perpendicular to said first resonant mode.

When measured values of the second frequency and the third frequency of the second resonant mode and the third resonant mode, respectively, are less than desired values, and before remeasuring the first frequency of the first resonant mode, dielectric material is removed uniformly from at least one of:
  one of the opposite end faces,
  the first plane region,
  the second plane region,
  the third plane region, and
  a fourth plane region formed by removing dielectric material from the circularly curved side surface of the block, the fourth plane region being diametrically opposite to the second plane region and parallel thereto, and perpendicular to the pair of opposite end faces.

Subsequently, the second frequency and the third frequency of the second resonant mode and the third resonant mode, respectively, are remeasured to check whether remeasured values therefor are closer or equal to desired values for the second and third frequencies without exceeding the desired values of the first, second, and third frequencies.

In yet another embodiment, a method includes measuring a first frequency, a second frequency, and a third frequency of a first resonant mode, a second resonant mode, and a third resonant mode, respectively, of a dielectric resonator component of an RF filter, wherein the dielectric resonator component is a block of dielectric material having a spherical shape with a first plane region and a second plane region, the first plane region and the second plane region being perpendicular to each other. The first resonant mode has an electric-field component oriented in a direction substantially parallel to a diameter of the spherical shape and perpendicular to the first plane region; the second resonant mode has an electric-field component oriented in a direction perpendicular to the electric-field component of the first resonant mode, substantially parallel to a diameter of the spherical shape, and perpendicular to the second plane region; and the third resonant mode has an electric-field component oriented in a direction perpendicular to the electric-field components of the first and second resonant modes, and substantially parallel to a diameter of the spherical shape.

When measured values of the first, second, and third frequencies of the first, second, and third resonant modes, respectively, are less than desired values, removing dielectric material is removed from a surface of the block uniformly from at least one of:
  the first plane region,
  the second plane region,
  a third plane region formed by removing dielectric material from the surface of the block, the third plane region being perpendicular to both the first plane region and the second plane region,
  a fourth plane region formed by removing dielectric material from the surface of the block, the fourth plane region being diametrically opposite to the first plane region and parallel thereto, and perpendicular to the second plane region, and
  a fifth plane region formed by removing dielectric material from the surface of the block, the fifth plane region being diametrically opposite to the second plane region and parallel thereto, and perpendicular to the first plane region.

Subsequently, the first, second and third frequencies of the first, second, and third resonant modes, respectively, are remeasured to check whether values therefor are closer or equal to desired values for the first, second, and third frequencies without exceeding the desired values of the first, second, and third frequencies.

BRIEF DESCRIPTION OF THE DRAWINGS

In the attached Drawing Figures:

FIG. 2, which includes both FIGS. 2A and 2B, illustrates the dielectric resonator component of FIG. 1 with a test structure and transmission line attached, where

FIG. 3, which includes

FIG. 4 includes FIGS. 4A to 4K.

FIG. 5, which includes

DETAILED DESCRIPTION OF THE DRAWINGS

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As described above in part, what is needed to perform tuning operations on individual resonator components of a filter separately is the ability to calculate the desired target frequencies of the separate components, to measure the actual resonant frequencies of the components, and then to perform physical adjustments on the components to bring their actual frequencies into agreement with the target frequencies. Once this is done to the precision and accuracy required for a filter assembled from the tuned components to have a response within specification, the component is considered tuned. The present specification is concerned with the physical adjustment of the dielectric resonator component or components of a filter to bring its actual resonant frequencies into agreement with its target frequencies.

Further, when the one or more of the resonant components is a multimode resonator, then at least as many independent physical adjustments are required as there are resonant mode frequencies to be adjusted. Typically, with multimode resonators, each individual physical adjustment alters more than one of the mode frequencies, so that there is no one-to-one correspondence between an individual physical adjustment and an individual mode frequency change. As a consequence, when a multimode component is to be tuned conveniently, some means of calculating the set of physical adjustments which will effect a desired set of changes in the mode frequencies is required.

In the absence of the techniques presented herein, and in the case where the physical adjustments are performed by means of a series of tuning screws or other similar devices whose actions are reversible, the fact that one physical adjustment typically alters more than one mode frequency is not too troublesome because a skilled operator can perform combinations of adjustments to move particular frequencies in desired directions, and take additional corrective actions in the forward and reverse directions until the desired frequency shifts have been obtained. However, if the operator were in possession of techniques for calculating the set of physical adjustments which will effect a desired set of changes to the mode frequencies, the required number of actions could be minimized, thus saving valuable time while tuning. Further, the skill level required of the operator would be reduced.

In the absence of such techniques, and in the case where the physical adjustments are not reversible, such as, for example, a drilling or lapping operation or the denting of a metal enclosure, the fact that one physical adjustment typically alters more than one mode frequency is quite troublesome because even a skilled operator will need to perform much smaller steps to avoid overshooting the desired target frequencies. The procedure will be one of making many small adjustments to gradually approach the correct result for all of the modes. In the event that the physical adjustments overshoot the target, the part will need to be scrapped, or reworked. Thus, in this situation, the absence of such techniques greatly increases the time for tuning and the amount of wastage, thus making the production process much more expensive. Nevertheless, this is a situation of the type to which the present application is directed.

As discussed above, the full tuning process described herein requires a filter design which can be split into individual dielectric resonator components, where these components are configured to allow the resonant frequencies to be measured, where the desired resonant frequencies can be calculated, and where methods to adjust the frequencies of the resonant modes are available, the present specification relating primarily to the latter. Each of these aspects will now be described. For ease of reference, this disclosure is divided into sections.

Section 1: Measurement and Introduction to a Filter Component

In order to measure the resonant frequencies of a multimode resonator, it is necessary to affix to the multimode resonator some kind of measurement device which couples to all of its resonator modes. Such a device needs to be positioned so as to be exposed to portions of the electric and/or magnetic fields of all of the modes of interest in the resonator. The design of the measurement device needs to permit an exchange of energy with the resonator modes by way of the above-mentioned electric and magnetic fields.

Figure 1:
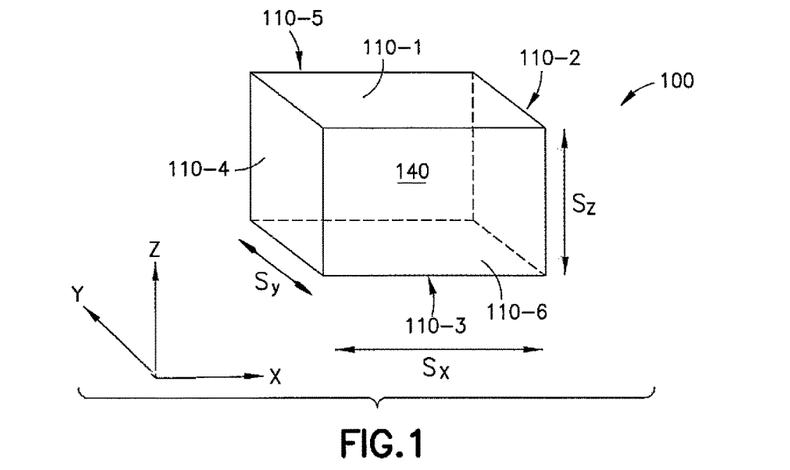
FIG. 1 is an example of a dielectric resonator component.

An example of a dielectric resonator component that will be used in some of the techniques presented below is a cuboid, as illustrated in FIG. 1. The cuboid component 100 (also called a resonator) includes a dielectric cuboid 140 that has six sides: a top side 110-1, a right side 110-2, a bottom side 110-3, a left side 110-4, a back side 110-5, and a front side 110-6. Each individual side 110 is also considered to be a face of the component 100. The sides 110 are typically covered with conductive material (see FIG. 2A). The X, Y, and Z axes are shown, as are the corresponding dimensions $S_x$, $S_y$, and $S_z$. These axes are used throughout the figures. It is noted that the cuboid is used merely for ease of exposition, and other components 100 may be used, as is illustrated below.

Figure 2A:
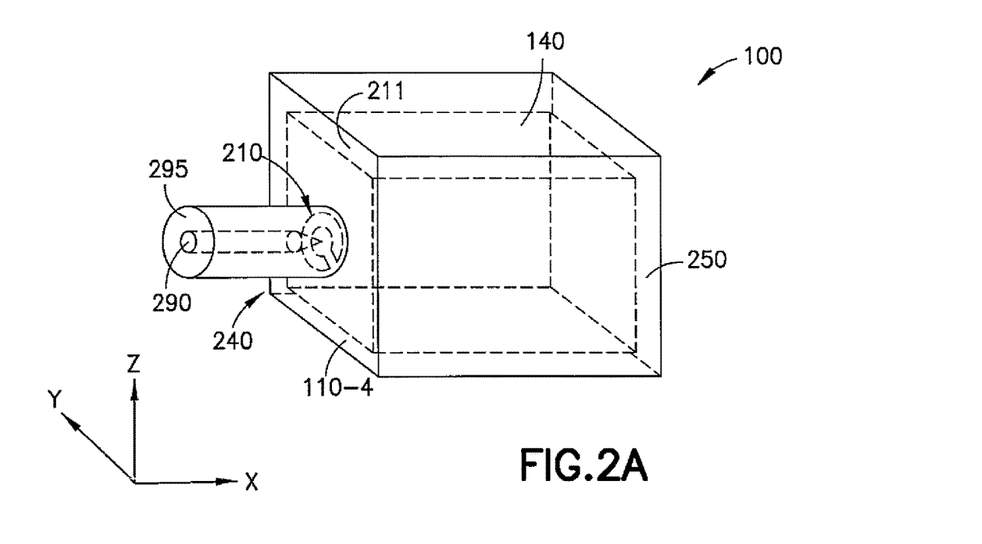
FIG. 2A illustrates the test structure attached to a face of the dielectric resonator component and the transmission line connected to the test structure, and where
Figure 2B:
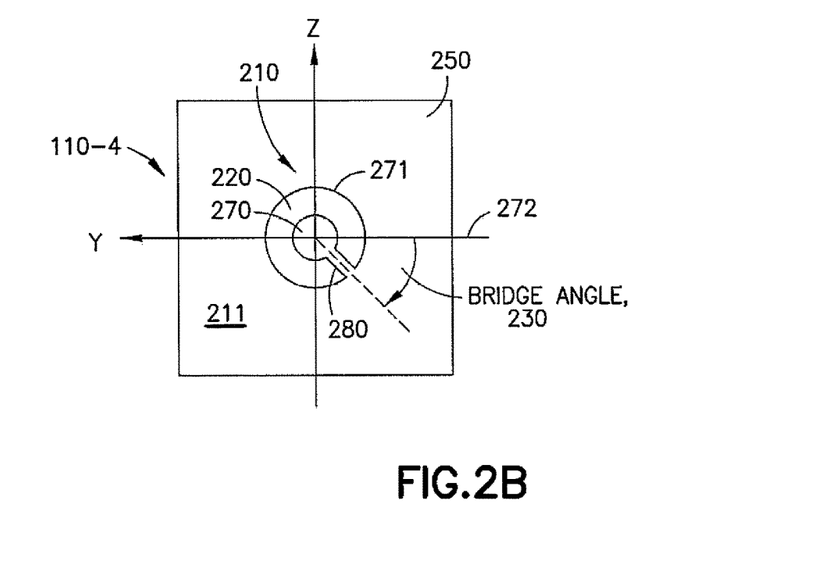
FIG. 2B illustrates the face of the dielectric resonator component on which the test structure is attached.

An example of a measurement structure 210 is shown in FIG. 2, and will be referred to as a keyhole. FIG. 2 includes both FIGS. 2A and 2B, and illustrates the filter component of FIG. 1 with a keyhole 210. FIG. 2A illustrates the keyhole 210 on a face 110-4 of the filter component, and illustrates a transmission line connected to the keyhole 210. FIG. 2B illustrates the face 110-4 of the filter component 100 on which the keyhole 210 is formed. The face 110-4 has a surface 211. The filter component 100 has a conductive coating 250 that covers a dielectric cuboid 140. This keyhole 210 is formed in part as a C-shaped region 220 devoid of metallization in an otherwise continuous coating 250 on the exterior of a ceramic resonator component 100. The keyhole 210 comprises also a central conductive island 270 with a short conductive bridge 280 connecting the island 270 to the surrounding grounded perimeter 271 (of the coating 250). The center conductor 290 of an external coaxial or similar transmission line 240 is connected to the island 270 of the keyhole 210 and the shield 295 of the transmission line 240 is connected to the grounded perimeter 271 of the keyhole 210. The island 270 couples to any electric field striking the inside surface of the conductive coating 250 in the location of the keyhole 210, while the bridge 280 couples to any magnetic field running parallel to the surface 211 and at any angle not parallel to the bridge 230 at the location of the keyhole 210. Such a keyhole 210 will exchange energy with any resonant modes which conform to the above field distributions, and so will permit the frequencies of those modes to be determined by connecting the above transmission line to a vector network analyzer (VNA) or similar instrument.

Figure 3A:
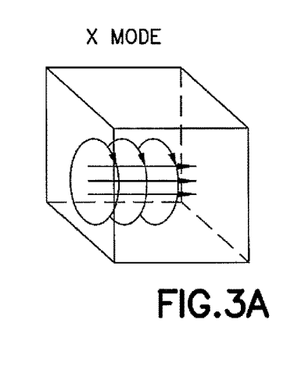
FIGS. 3A, 3B, and 3C, illustrates electric and magnetic fields of the X (FIG. 3A) modes, Y (FIG. 3B) modes, and Z (FIG. 3C) modes, for a dielectric resonator component in the shape of a cuboid.
Figure 3B:
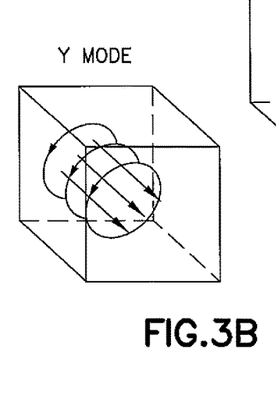
Figure 3C:
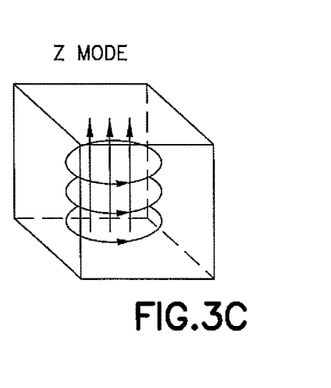

We consider the case where the multimode resonator is a ceramic block formed into a cuboid shape and covered with a conducting layer, such as one of silver (see FIG. 1). The three lowest order modes of such a resonator will frequently be employed as the active in-band modes of the filter, so only those modes will be considered here. The three lowest order modes have electric fields running in the three orthogonal directions which are parallel to the axes of the cube, and have magnetic fields circulating around the main axis of the electric field, as illustrated in FIG. 3. The modes with electric field lines running parallel to the X, Y and Z axes are referred to as the X (FIG. 3A), Y (FIG. 3B) and Z (FIG. 3C) modes, respectively.

Figure 4A:
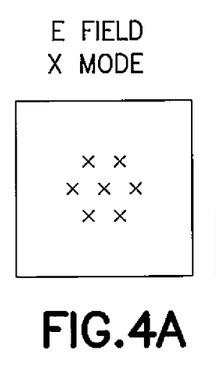
FIGS. 4A, 4C, 4E, 4G, and 4I indicate electric (E) fields for the X mode, Y mode, Z mode, X21 mode, and X12 mode, respectively.
Figure 4B:
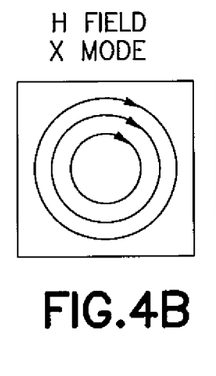
FIGS. 4B, 4D, 4F, 4H, and 4J indicate magnetic (H) fields for the X mode, Y mode, Z mode, X21 mode, and X12 mode, respectively.
Figure 4C:
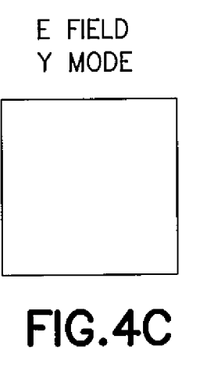
Figures 4D, 4F:
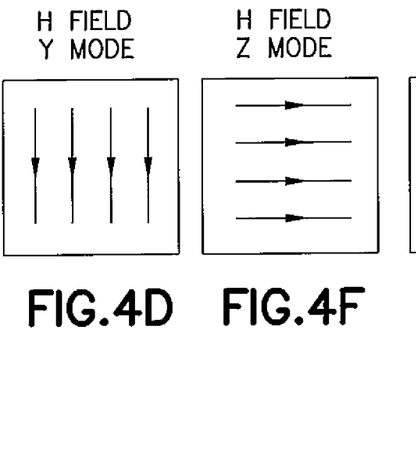
Figure 4E:
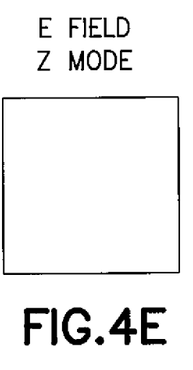
Figure 4G:
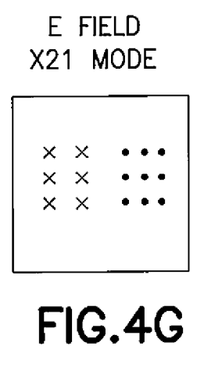
Figure 4H:
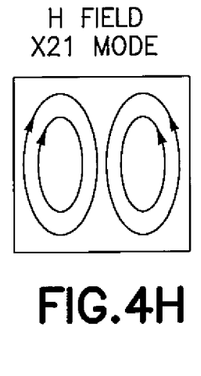
Figure 4I:
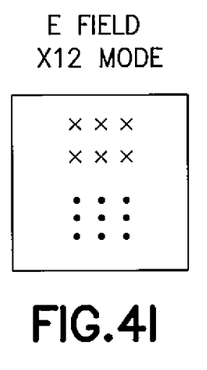
Figure 4J:
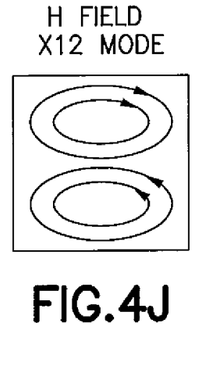
Figure 4K:
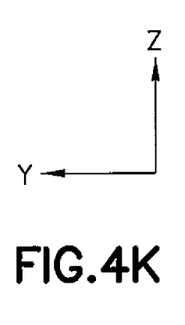
FIG. 4K illustrates the planar orientation for FIGS. 4A to 4J.

The field distribution of most relevance to a measurement structure set into the conductive coating of the multimode resonator, such as keyhole 210, is that which occurs at the boundary between the ceramic and the inside surface of the conductive coating on the face on which the keyhole 210 is located. For this example, we consider the situation where the keyhole 210 has been placed upon one of the X faces, as shown in FIG. 2. FIG. 4 shows the electric and magnetic fields existing at the boundary between the ceramic and the conductive coating of the X face. The electric field of the X mode strikes the inside of the conductive coating perpendicularly, reaching a maximum at the center of the face and dropping to zero at the edges. This is indicated by the group of small crosses in the center of FIG. 4A. The corresponding magnetic field circulates around the face, having a maximum strength at the edge, and dropping to zero in the center, as shown in FIG. 4B. The Y and Z modes illustrated in FIGS. 4C to 4F have zero electric field over the entire face (see FIGS. 4C and 4E), while the corresponding magnetic fields are parallel to the Z and Y axes (see FIGS. 4D and 4F), respectively. Examples of additional higher order modes are shown in FIGS. 4G to 4J. FIG. 4K illustrates the planar orientation for FIGS. 4A to 4J.

If a keyhole is formed in the center of the X face, then the electric field of the X mode will couple to the keyhole island 270, and, when the bridge 280 is oriented at a non-perpendicular angle to both the Y and Z directions, for example, 45 degrees, the magnetic fields of both the Y and the Z modes will couple to the bridge 280. As a result, the keyhole will couple to all three of the modes of interest, therefore permitting their resonant frequencies to be measured. Examination of the magnetic fields of the additional modes shown in FIGS. 4H and 4J shows that the keyhole will also couple to both of these. This illustrates that the important aspect of the mode fields for determining whether significant coupling takes place is whether there is significant electric field striking the island and whether there is significant magnetic field not parallel to the bridge.

Figure 5A:
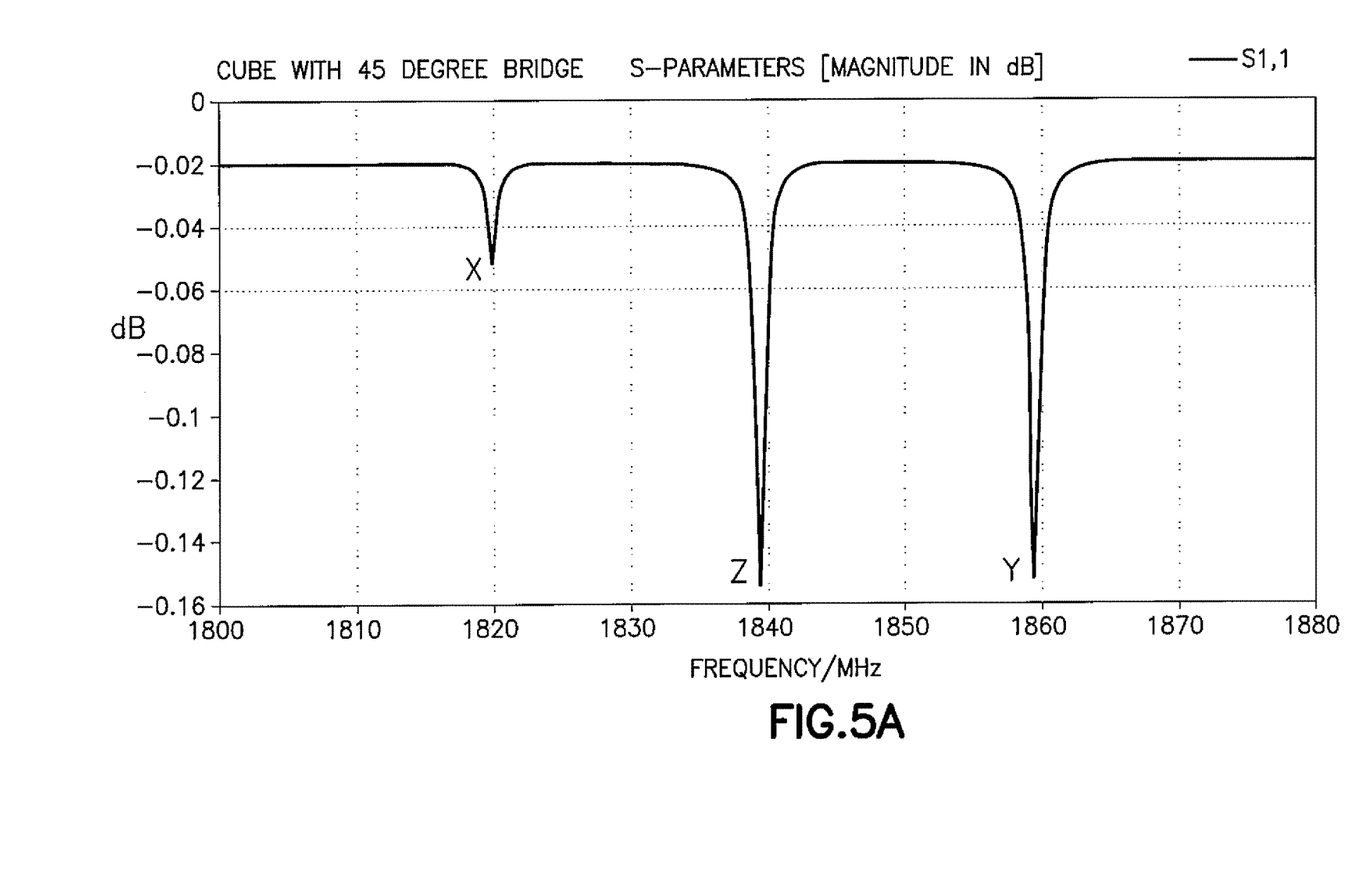
FIGS. 5A and 5B, illustrates S-parameters (in dB versus frequency) for cubes with a 45-degree bridge angle (FIG. 5A) and a 37-degree bridge angle (FIG. 5B)
Figure 5B:
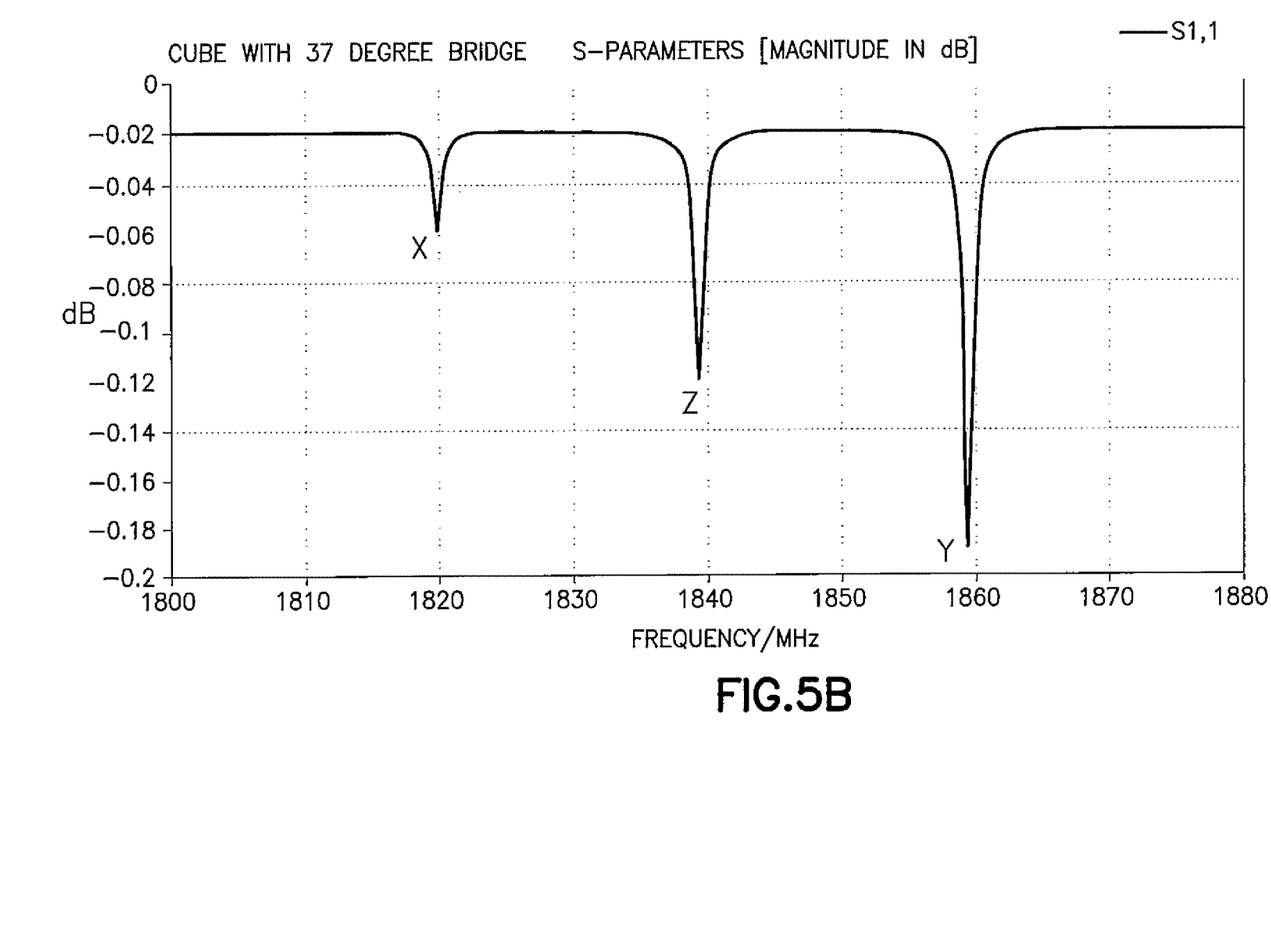

An example of such a measured signal is shown in FIG. 5A. FIG. 5 includes FIGS. 5A and 5B, and illustrates S-parameters (in dB versus frequency) for cubes with a 45-degree bridge angle (FIG. 5A) and a 37-degree bridge angle (FIG. 5B). The lowest frequency dip is the X mode, the next dip is the Z mode and the highest frequency dip is the Y mode. Note that the depths of the dips are not the same. By changing the angle 230 of the bridge 280 relative to the Y axis 272 in FIG. 2, the relative heights of the Y mode and Z mode dips can be varied, with approximate equality occurring at 45 degrees, as seen in FIG. 5A. The X mode dip is smaller than the other two. If the keyhole 210 is placed in the center of the one of the faces of the cuboid resonator 100, and the angle of the bridge 280 is set to about 37 degrees to the Y axis 272, rather than the more obvious and symmetrical 45 degrees, then the amplitudes of the dips form a sequence in the order X smallest, Z intermediate and Y largest, which can assist in the identification of the dips during a frequency measurement. This signal is illustrated in FIG. 5B.

The use of a carefully chosen bridge angle 230 to provide identification of the modes corresponding to each dip provides a particular advantage in situations where the multimode resonator 100 has two or more mode frequencies which are sufficiently close that they may overlap or even cross, such as by the Y mode frequency becoming less than the Z mode frequency, during the tuning process. In such a situation, the ability to unambiguously identify the modes based only on the dip amplitudes avoids the need for auxiliary mode identification procedures, such as provision of an additional measurement structure elsewhere on the resonator.

Section 2: Physical Adjustment

A variety of physical adjustment methods are possible, such as removing ceramic material, drilling holes, inserting tuning screws and deforming a metal enclosure. A set of such methods may be employed to allow multiple mode frequencies to be altered. The essential feature is that the set of methods must provide a sufficient number of independent adjustments to allow the resonant frequencies of all of the desired modes to be altered. Each physical adjustment may comprise one or more individual actions, such as adjusting a tuning screw, drilling a hole, or lapping material from a surface. In the present specification, we shall be concentrating upon the removal of material from a surface, such as by lapping, or by grinding or milling.

In order to implement the techniques presented herein, it is necessary that there be the same number of adjustments as the number of mode frequencies requiring adjustment. Each adjustment may be composite, meaning that it includes a number of separate manipulations or operations, but the number of independent composite adjustments must equal the number of modes. It is also desirable that the adjustments be quantified, so that the amount or size or extent of the adjustments can be specified by a mathematical procedure. For example, we consider the case of a cuboid resonator where the three lowest order modes are to be adjusted, and where the adjustments to be employed are uniform removal of material from three orthogonal faces. Useful quantifications in this case are the three side lengths of the cuboid, or the amounts of material removed from each of the faces, or the change in size of the three side lengths. As another example, consider a cylindrical resonator where the three lowest order modes are to be adjusted. One adjustment could be uniform removal of material from one of the flat faces, quantified by the height of the cylinder. The second adjustment could be the drilling of two holes of equal depth oppositely located on the curved surface, and quantified by the depth of the holes. The third adjustment could be another pair of equal depth holes located on the curved surface but orthogonally located relative to the first pair of holes, and quantified by the depth of the holes.

One convenient method for adjusting the resonant frequencies of a silvered ceramic resonator is to remove the silver from several regions to expose the ceramic, then to remove specified amounts of the ceramic from each exposed region, and finally to resilver the regions. Each of these sequences of activities on a particular region constitutes an individual adjustment action (as described above), where the action may be quantified by the depth of ceramic removed, or alternatively by the change in the corresponding dimension of the part. We will refer to this as the lapping method. If the regions are comparable in size with a side of the resonator, then this method has the advantage that it minimally disturbs the geometry of the resonator and so largely preserves the distribution of electric and magnetic fields of the modes of interest.

Figure 6:
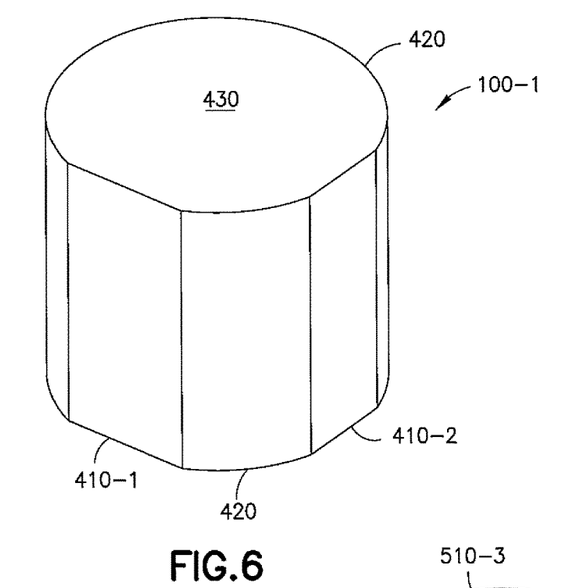
FIG. 6 illustrates a dielectric resonator component in the shape of a cylinder with regions removed.
Figure 7:
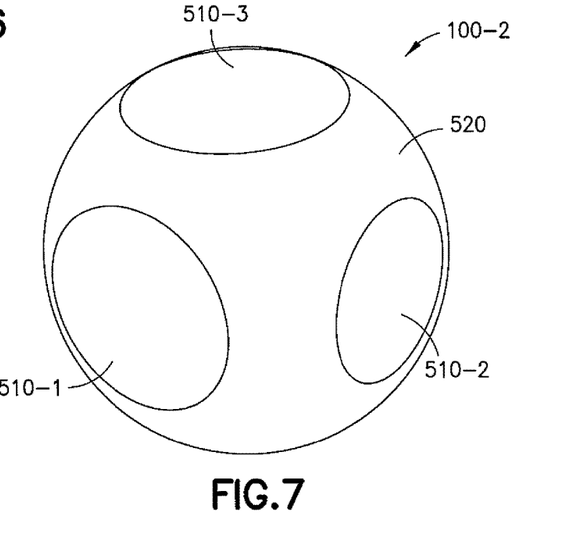
FIG. 7 illustrates a dielectric resonator component in the shape of a sphere with regions removed.

This method is very well adapted to a cuboid resonator, where the above mentioned regions are three orthogonal faces, such as those illustrated in FIG. 1. However, it also may be applied to other shapes, such as a cylindrical resonator, where one region is the flat top, and the other two regions are removed from the curved surfaces such that the resulting regions form three substantially perpendicular flattened areas. This is illustrated in FIG. 6, which shows a cylindrical resonator 100-1. The flat top 430 is shown, as is the outer curved surface 420 of the cylinder resonator 100-1. Two regions 410-1 and 410-2 are removed from the curved surface 420. The two regions 410-1 and 410-2 are planes which are perpendicular to each other and to the flat top 430. Resonator 100-1 may then be described as a truncated cylinder. A similar set of adjustment actions can be performed on a sphere, as illustrated in FIG. 7. FIG. 7 illustrates a spherical resonator 100-2 with an outside surface 520 and three regions 510-1, 510-2, and 510-3 removed from the outside surface 520. The adjustment information quantifying the adjustments might then be the amounts of material removed from each of the three substantially orthogonal regions. The three regions 510-1, 510-2, and 510-3 are planes which are mutually perpendicular to one another. Resonator 100-2 may then be described as a truncated sphere.

A set of adjustment actions which are suitable for adjusting the resonant frequencies of a bare ceramic block located in a conductive enclosure is similar to that described above, except that, because there is no silver coating, the ceramic can be removed directly. The removal of ceramic from a particular region constitutes an individual adjustment. We will refer to this as the direct lapping method. The locations and manner of ceramic removal for the examples of cuboidal, cylindrical and spherical blocks are the same as for the silvered case above. Of course, the blocks may need to be removed from the enclosure to perform the adjustment and then replaced afterward.

Section 3: Additional Considerations for Tuning a Cuboid Resonator

In the case of a cuboid resonator, whose three lowest order resonant modes, labelled X, Y, and Z, have their electric fields entirely in the X-direction, the Y-direction, and the Z-direction, when material is removed uniformly from one of the faces perpendicular to the X-direction, the frequencies of the Y and Z modes will increase, while the frequency of the X mode will be unchanged. As a consequence, in order to tune the frequencies of the X, Y, and Z modes, it is generally necessary to remove material from three mutually perpendicular faces.

Figure 8A:
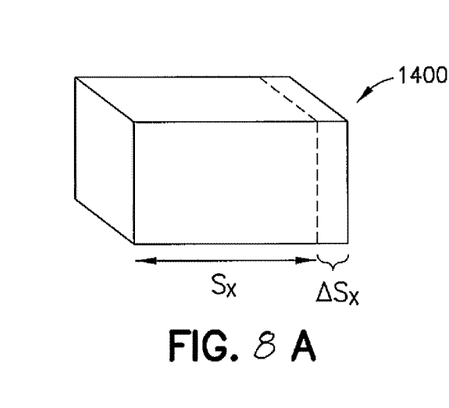
FIGS. 8A, 8B, and 8C represent possible physical adjustments in the X, Y, and Z directions, respectively, of a cuboid resonator.
Figure 8B:
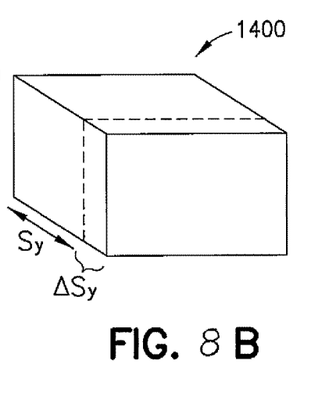
Figure 8C:
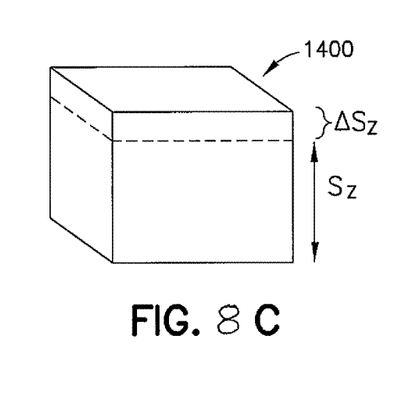
Figure 8D:
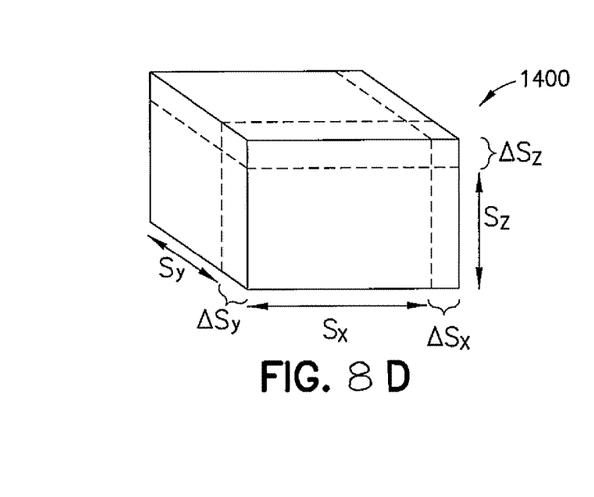
FIG. 8D shows multiple physical adjustments in the X, Y, and Z directions.

For purposes of illustration, FIGS. 8A, 8B, and 8C represent possible adjustments in the X, Y, and Z directions, respectively, of a cuboid resonator. Each cuboid component 1400 is a version of cuboid component 100, with one dimension elongated along one axis. FIG. 8A shows an adjustment, $\Delta S_X$, in the X direction for a cuboid component 1400. FIG. 8B shows an adjustment, $\Delta S_Y$, in the Y direction for the cuboid component 1400, and FIG. 8C shows an adjustment, $\Delta S_Z$, in the Z direction for the cuboid component 1400. One axis in each of FIGS. 8A, 8B, and 8C is shown elongated to draw attention to the axis being adjusted. This does not imply that the adjustment must be carried out on the longest axis. The three diagrams are meant to represent three possible adjustments which might be performed on a single component. A single one or multiple ones of these adjustments may be performed. For example, FIG. 8D illustrates adjustments (in X, Y, and Z directions) being performed on the same cuboid, and other combinations such as X and Y, X and Z, and Y and Z could be performed on the same cuboid.

Section 4: Additional Considerations for Tuning a Cylindrical Resonator

In the case of a cylindrical resonator, one of the three lowest order resonant modes is in the axial direction. The other two are in transverse directions and are mutually perpendicular to one another and to the mode in the axial direction. The electric field of the mode in the axial direction is parallel to the axis of the cylinder, but the electric field of each of the two transverse modes is parallel to the diameter of the cylinder only near the center, or axis, of the cylinder, where they are perpendicular to those of the other transverse mode. At other points within the cylinder farther from the center, or axis, the electric field of each of the transverse modes diverges so as to be perpendicular to points on the circularly curved side surface of the cylinder.

When dielectric material is removed uniformly from one of the end faces of the cylinder, the frequencies of the two transverse modes will increase, but the frequency of the axial mode will remain unchanged. In contrast, when dielectric material is removed uniformly from the circularly curved side surface of the cylinder, so as to create a plane region, or truncation, the frequency of the axial mode and the frequency of the transverse mode whose electric field is substantially parallel to the truncation surface will increase, while the frequency of the other transverse mode whose electric filed is substantially perpendicular to the truncation surface will decrease. The magnitude of the increases will be larger than the magnitude of the decrease.

Section 5: Additional Considerations for Tuning a Spherical Resonator

In the case of a spherical resonator, the three lowest order resonant modes are in three mutually perpendicular directions with respect to one another. The electric field of each of the modes is parallel to the diameter of the sphere only near the center, where they are perpendicular to those of the other two modes. At other points within the sphere farther from the center, the electric field of each of the transverse modes diverges so as to perpendicular to points on the surface of the sphere.

When dielectric material is removed uniformly from the surface of the cylinder, so as to create a plane region, or truncation, the frequencies of the two modes having electric fields substantially parallel to the truncation surface will increase, while the frequency of the mode whose electric field is substantially perpendicular to the truncation surface will decrease. The magnitude of the increases will be larger than the magnitude of the decrease. In order to tune a spherical resonator, dielectric material generally has to be removed from three mutually perpendicular plane regions.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:
1. A method comprising:
measuring a first frequency of a first resonant mode of a dielectric resonator component of an RF filter, said dielectric resonator component being a block of dielectric material having a cuboid shape with three pairs of opposite faces, said first resonant mode having an electric-field component oriented in a direction perpendicular to one of said pairs of opposite faces and parallel to the other two pairs of opposite faces;

when a measured value of said first frequency of said first resonant mode is less than a desired value, removing dielectric material uniformly from at least one face of the two pairs of opposite faces parallel to the electric-field component of the first resonant mode to maintain the cuboid shape of the block of dielectric material; and remeasuring said first frequency of said first resonant mode to check whether a value of the remeasured first frequency is closer or equal to the desired value without exceeding the desired value, and further comprising:

after measuring said first frequency of said first resonant mode, and before removing dielectric material uniformly from at least one face of the two pairs of opposite faces parallel to the electric-field component of the first resonant mode, measuring a second frequency of a second resonant mode of the dielectric resonator component of the RF filter, said second resonant mode having an electric-field component oriented in a direction perpendicular to the electric-field component of the first resonant mode and parallel to a pair of opposite faces;

when a measured value of said second frequency of said second resonant mode is less than a desired value, and before remeasuring said first frequency of said first resonant mode, removing dielectric material uniformly from at least one face of the two pairs of opposite faces parallel to the electric-field component of the second resonant mode to maintain the cuboid shape of the block of dielectric material; and remeasuring the second frequency of said second resonant mode to check whether a value of the remeasured second frequency is closer or equal to a desired value for the second frequency without exceeding the desired value of the second frequency.

2. The method as claimed in claim 1, wherein removing dielectric material uniformly from at least one face of the two pairs of opposite faces parallel to the electric-field component of the first resonant mode is performed by at least one of lapping, grinding, and milling.

3. The method as claimed in claim 1, wherein removing dielectric material uniformly from at least one face of the two pairs of opposite faces parallel to the electric-field component of the second resonant mode is performed by at least one of lapping, grinding, and milling.

4. A method comprising:

measuring a first frequency of a first resonant mode of a dielectric resonator component of an RF filter, said dielectric resonator component being a block of dielectric material having a cuboid shape with three pairs of opposite faces, said first resonant mode having an electric-field component oriented in a direction perpendicular to one of said pairs of opposite faces and parallel to the other two pairs of opposite faces;

when a measured value of said first frequency of said first resonant mode is less than a desired value, removing dielectric material uniformly from at least one face of the two pairs of opposite faces parallel to the electric-field component of the first resonant mode to maintain the cuboid shape of the block of dielectric material; and remeasuring said first frequency of said first resonant mode to check whether a value of the remeasured first frequency is closer or equal to the desired value without exceeding the desired value, and further comprising:

after measuring said first frequency of said first resonant mode, and before removing dielectric material uniformly from at least one face of the two pairs of opposite faces parallel to the electric-field component of the first resonant mode, measuring a second frequency and a third frequency of a second resonant mode and a third resonant mode, respectively, of the dielectric resonator component of the RF filter, said second and third resonant modes having respective electric-field components oriented in directions perpendicular to the electric-field component of the first resonant mode, perpendicular to each other, and parallel to pairs of opposite faces;

when measured values of said second frequency and said third frequency of said second resonant mode and said third resonant mode, respectively, are less than desired values, and before remeasuring said first frequency of said first resonant mode, removing dielectric material uniformly from at least one face of the two pairs of opposite faces parallel to the electric-field component of the second resonant mode and from at least one face of the two pairs of opposite faces parallel to the electric-field component of the third resonant mode to maintain the cuboid shape of the block of dielectric material; and remeasuring said second frequency and said third frequency of said second resonant mode and said third resonant mode, respectively, to check whether values of the remeasured second frequency and remeasured third frequency are closer or equal to desired values for the second and third frequencies without exceeding the desired values of the second and third frequencies.

5. The method as claimed in claim 4, removing dielectric material uniformly from at least one face of the two pairs of opposite faces parallel to the electric-field component of the second resonant mode and from at least one face of the two pairs of opposite faces parallel to the electric-field component of the third resonant mode is performed by at least one of lapping, grinding, and milling.

6. The method as claimed in claim 4, wherein removing dielectric material uniformly from at least one face of the two pairs of opposite faces parallel to the electric-field component of the first resonant mode is performed by at least one of lapping, grinding, and milling.

* * * * *